United States Patent [19]
Hutchison et al.

[11] Patent Number: 6,118,662
[45] Date of Patent: Sep. 12, 2000

[54] ENCLOSURE FOR TELECOMMUNICATIONS EQUIPMENT

[75] Inventors: Randy Hutchison, Shawnee; Robert Shiffbauer, Olathe, both of Kans.

[73] Assignee: Special Product Company, Overland Park, Kans.

[21] Appl. No.: 09/434,235

[22] Filed: Nov. 5, 1999

[51] Int. Cl.[7] .................................................. H05K 7/20
[52] U.S. Cl. .......................... 361/704; 361/700; 361/702; 361/710; 361/717; 361/719; 361/722; 174/70 S; 174/16 HS; 165/80.3; 165/80.1; 165/80.2
[58] Field of Search .................................. 361/683, 687, 361/700–707, 710–714, 717–720, 722–723; 174/70 S, 47, 16 HS, 16.3, 52.1, 16 AS; 165/80.1, 106.33, 80.2, 80.3, 185, 177, 179, 181, 183; 138/108; 45/601

[56] References Cited

U.S. PATENT DOCUMENTS

| | | | |
|---|---|---|---|
| 4,528,615 | 7/1985 | Perry | 361/386 |
| 4,679,250 | 7/1987 | Davis et al. | 455/601 |
| 4,858,068 | 8/1989 | Birller et al. | 361/380 |
| 4,962,445 | 10/1990 | Pelet et al. | 361/386 |
| 5,105,337 | 4/1992 | Bitler et al. | 361/386 |

FOREIGN PATENT DOCUMENTS

| | | | |
|---|---|---|---|
| 357102058A | 6/1982 | Japan | H01L 23/34 |
| 360079834A | 5/1985 | Japan | H04B 3/02 |
| 408065868A | 3/1996 | Japan | H02G 9/02 |
| 2193552 | 2/1988 | United Kingdom | H04B 9/00 |

*Primary Examiner*—Leo Picard
*Assistant Examiner*—Michael Datskovsky
*Attorney, Agent, or Firm*—Hovey, Williams, Timmons & Collins

[57] ABSTRACT

An enclosure (10) for protecting and dissipating heat from telecommunications repeaters (12). The enclosure includes a plurality of card-receiving sleeves (14) for receiving repeater cards; at least one heat sink manifold (16) in contact with the sleeves for conducting heat from the sleeves; at least one outer panel (28) in contact with the heat sink manifold for conducting heat from the manifold; a removable cover (40) configured for sliding over the outer panel to protect the cards from exposure to the elements; and at least one biasing mechanism (112) operably coupled with the outer panel for biasing the outer panel into physical contact with the cover when the cover is placed thereover to improve conduction of heat from the outer panel to the cover.

9 Claims, 4 Drawing Sheets

ENCLOSURE FOR TELECOMMUNICATIONS EQUIPMENT

BACKGROUND OF THE INVENTION

1. Field of the Invention

The present invention relates to enclosures for protecting and dissipating heat from electronic equipment such as telecommunications repeaters. More particularly, the invention relates to such an enclosure that effectively dissipates heat in a passive manner and that is lightweight, inexpensive, space efficient and durable enough to be used in any applications.

2. Description of the Prior Art

The ever-increasing use of the internet, wide area networks, and other networks has increased the demand for high-speed, high-bandwidth digital telecommunications services such as ISDN, DSL, and T1 services in homes and businesses. Because of signal propagation limitations, these digital services require the use of repeaters to repeat signals if end users are too far from their provider's central office.

The repeaters used for these digital services are typically housed in protective enclosures that are mounted to telephone poles or placed next to buildings or in manholes. The enclosures must be designed to protect the repeaters from natural elements such as sun, rain, snow, and fire as well as damage from vandalism and attempted theft.

Just as importantly, the enclosures must be designed to dissipate excess heat generated by the repeaters. All electronic components generate heat that must be dissipated to ensure optimum and reliable operation. Such heat dissipation has become increasingly more difficult as electronic components have become faster, more powerful, and smaller, and therefore hotter. Heat dissipation from remote telecommunications equipment such as repeaters is particularly difficult because telecommunications enclosures are typically not connected to electricity sources and therefore cannot rely on fans or other active cooling elements. The enclosures therefore must be designed to dissipate heat passively by conduction and convection to ambient air, which can frequently reach temperatures of well over 100° F., especially when the enclosures are exposed to direct sunlight. In addition to weather protection and heat dissipation requirements, it is also desirable that telecommunications enclosures be lightweight, space efficient, and inexpensive.

Many prior art telecommunication enclosures attempt to passively dissipate heat with heat sink methods. Heat sink dissipation methods require that all components that are conducting heat from repeaters in an enclosure contact either the repeaters directly or other components touching the repeaters to form a continuous thermal conduction path from the repeaters. Prior art enclosures attempt to obtain such continuous thermal conduction path with complicated mechanical linkage assemblies that are expensive to manufacture, difficult to use and that increase the size and weight of their enclosures.

There is therefore a need for an improved telecommunications enclosure that protects repeaters and other electronics from exposure to weather conditions and damage from vandalism; that more effectively dissipates excess heat from the electronic components in a passive manner; and that is relatively lightweight, space efficient, and inexpensive. There is also a need for such an enclosure that creates an improved path of thermal conduction from repeaters without the use of complicated, expensive, and heavy mechanical linkage assemblies.

OBJECTS AND SUMMARY OF THE INVENTION

The present invention solves the above-described problems and provides a distinct advance in the art of telecommunications enclosures. More particularly, the present invention provides a telecommunications enclosure that protects repeaters and other electronics from exposure to weather conditions and damage from vandalism, that more effectively dissipates excess heat from the electronic components in a passive manner, and that is relatively lightweight, space efficient, and inexpensive. The present invention also provides a telecommunications enclosure that creates an improved path of thermal conduction from repeaters without the use of complicated, expensive, and heavy mechanical linkage assemblies.

The telecommunications enclosure of the present invention broadly includes a plurality of card-receiving sleeves for receiving repeater cards; at least one heat sink manifold in contact with the sleeves for conducting heat from the sleeves; at least one outer panel in contact with the heat sink manifold for conducting heat from the manifold; a removable cover configured for sliding over the outer panel to protect the cards from exposure to the elements; and at least one biasing mechanism operably coupled with the outer panel for biasing the outer panel into physical contact with the cover when the cover is placed thereover to improve conduction of heat from the outer panel to the cover.

The biasing mechanism is preferably a plurality of leaf springs positioned between the heat sink manifold and the outer panel that bias the outer panel outwardly away from the heat sink manifold. When the cover is placed over the outer panel, the leaf springs bias the outside surface of the outer panel directly against the inside surface of the cover to improve the thermal conductivity therebetween.

These and other important aspects of the present invention are described more fully in the detailed description below.

BRIEF DESCRIPTION OF THE DRAWING FIGURES

A preferred embodiment of the present invention is described in detail below with reference to the attached drawing figures, wherein.

DETAILED DESCRIPTION OF THE PREFERRED EMBODIMENTS

Figure 1:
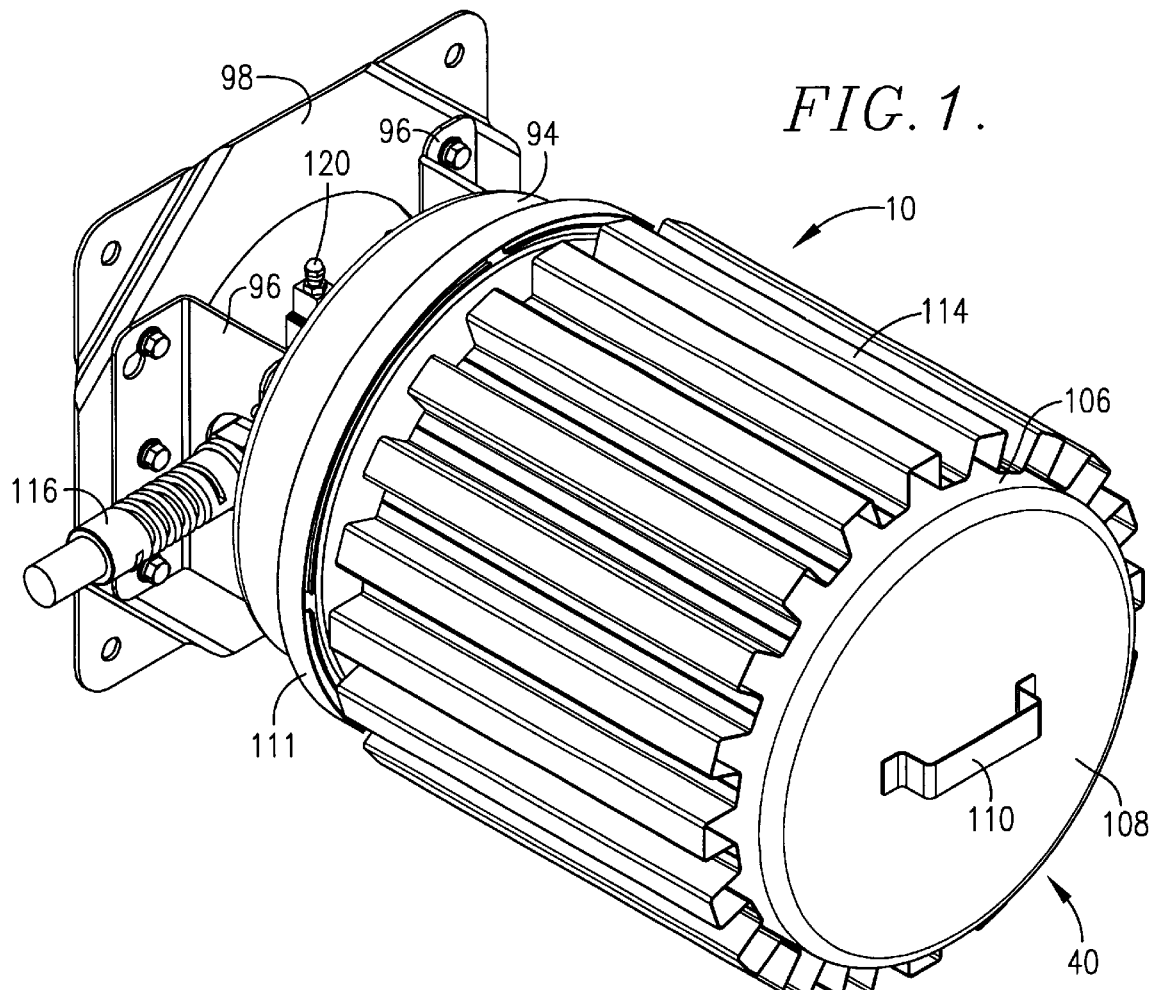
FIG. 1 is an isometric view of a telecommunications enclosure constructed in accordance with a preferred embodiment of the present invention.
Figure 3:
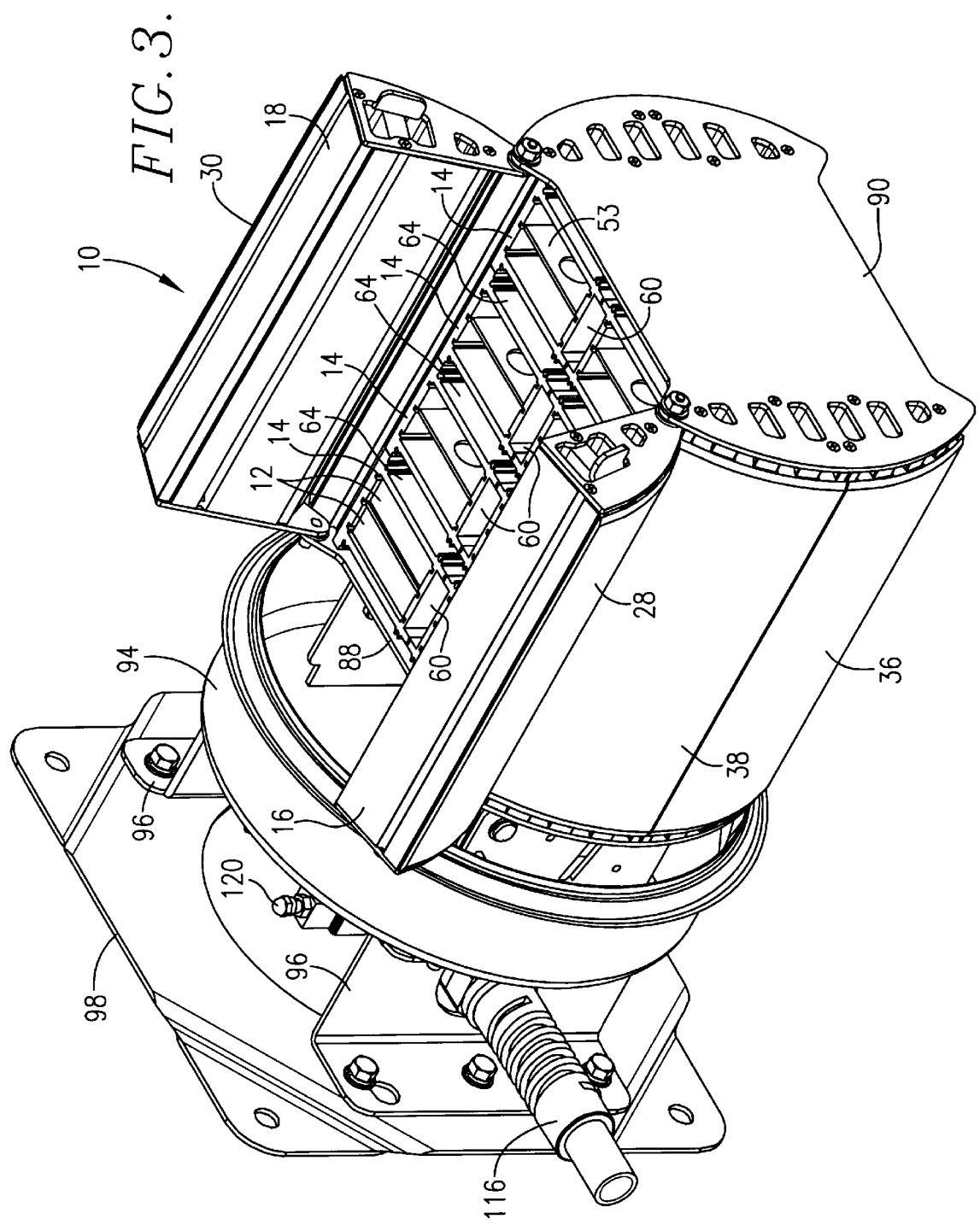
FIG. 3 is an isometric view of the enclosure with its cover removed and with its doors open.
Figure 6:
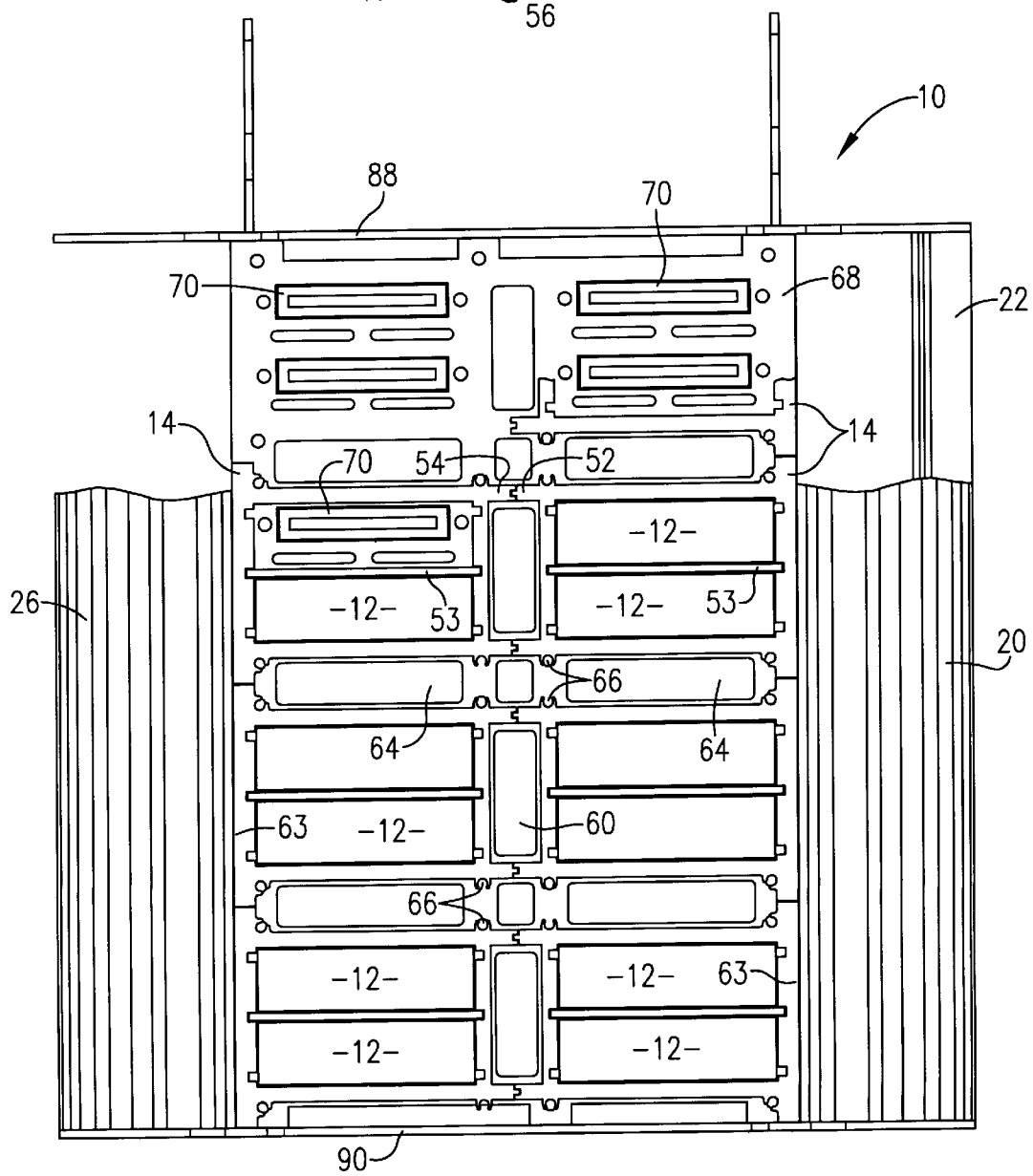
FIG. 6 is a partial fragmentary horizontal section view of the enclosure.

Turning now to the drawing figures and particularly FIG. 1, a telecommunications enclosure 10 constructed in accordance with a preferred embodiment of the invention is illustrated. The enclosure is configured for housing electronics such as telecommunications repeater cards 12 as illustrated in FIGS. 3, 4, and 6 to protect the cards from exposure to weather conditions and damage from vandalism and to dissipate excess heat from the cards.

Figure 4:
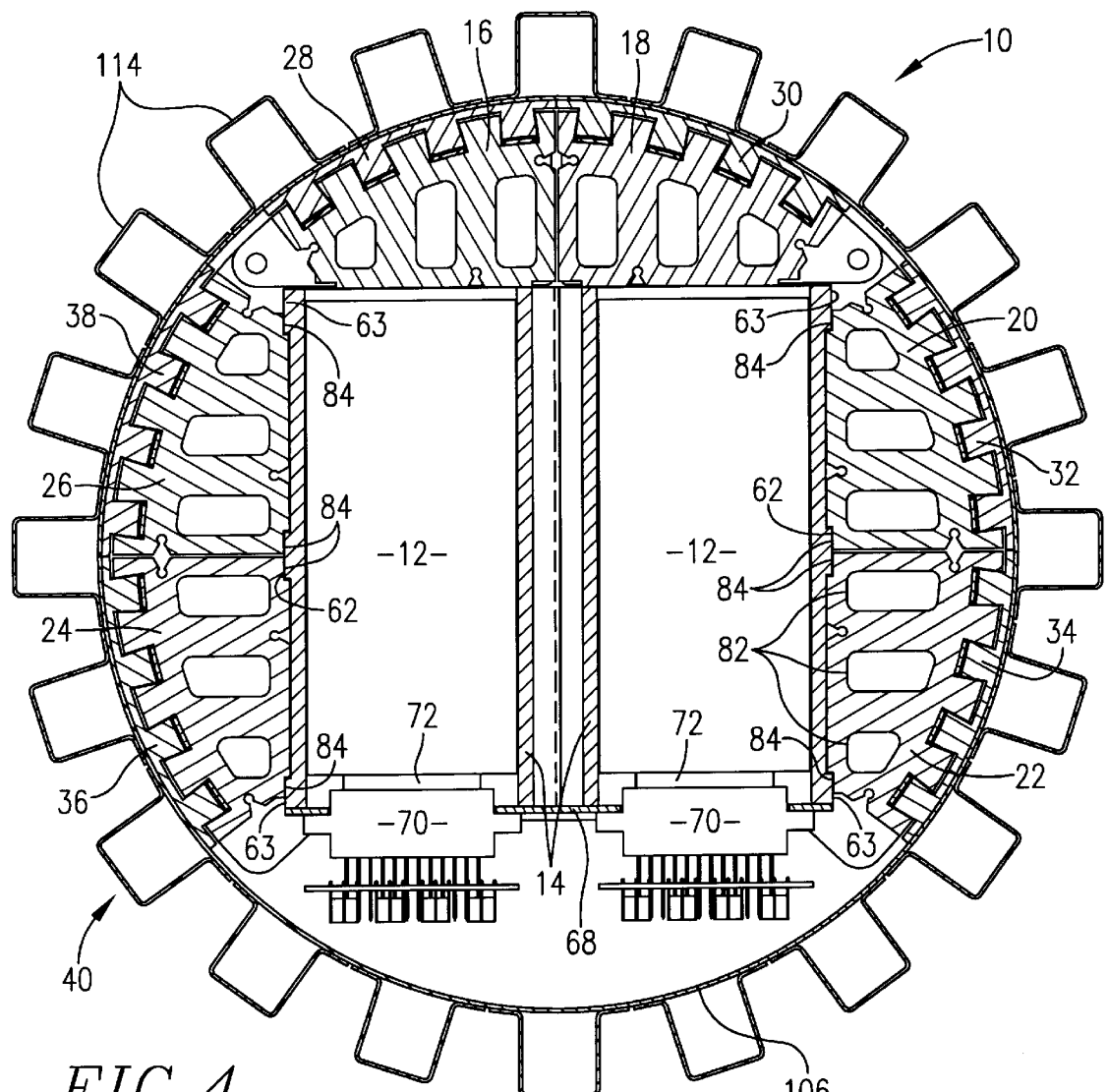
FIG. 4 is a vertical section view of the enclosure.

Referring to FIG. 4, the enclosure 10 broadly includes a plurality of card-receiving sleeves 14 for receiving and supporting the repeater cards 12, a plurality of heat sink manifolds 16, 18, 20, 22, 24, 26 surrounding the sleeves, a plurality of outer panels 28, 30, 32, 34, 36, 38 surrounding the heat sink manifolds, and a removable cover 40 configured for sliding over the outer panels. The sleeves, manifolds, and outer panels are preferably formed of extruded aluminum. The exterior parts including the pan 94 and cover 40 are preferably formed of stainless steel.

Figure 7:
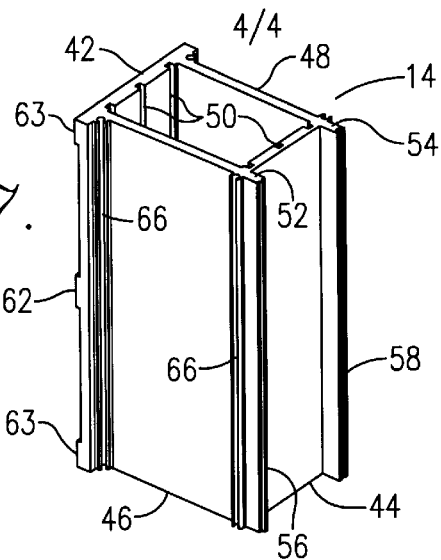
FIG. 7 is an isometric view of one of the card-receiving sleeves of the enclosure.

In more detail, and as best illustrated in FIG. 7, each of the sleeves 14 is generally rectangular in cross-section and includes a front wall 42, a rear wall 44, and a pair of spaced-apart side walls 46, 48 extending therebetween that together define a generally rectangular-shaped slot for receiving one or two repeater cards. The inner surfaces of the front and rear walls each includes three elongated, spaced slots or channels 50. As illustrated in FIG. 6, a divider 53 may be placed in the middle channels to subdivide the sleeve into two compartments for receiving two single-wide repeater cards. Alternately, dividers may be placed between each pair of end channels to configure the sleeve to receive a single double-wide repeater card.

Each of the sleeves is sized so that a repeater card positioned therein will firmly contact the inner surface of all the walls or dividers of the sleeve. Thus, heat that is generated by the repeater cards is conducted therefrom directly to the walls or dividers of the sleeves.

The rear wall 44 of the sleeve 14 includes a pair of short, longitudinally-extending, spaced-apart legs 52, 54 projecting outwardly therefrom. The end of one leg includes a rectangular-shaped tab 56 extending therefrom, and the end of the other leg includes a corresponding rectangular-shaped recess 58 therein. As illustrated in FIG. 6, two sleeves may be interconnected lengthwise by inserting the tab from one sleeve into the recess of the other and vice versa. When so interconnected, the legs and rear walls of the two sleeves form a generally rectangular-shaped opening 60 therebetween that permits air to pass therethrough. The opening aids in heat dissipation from the cards by convecting heat away from the sleeves.

The front wall 42 of each sleeve 14 includes a transversely-extending central flange 62 and two transversely-extending end flanges 63. The flanges interconnect with corresponding recesses 84 on the heat sink manifolds as illustrated in FIG. 4 and as described in more detail below. The end flanges of each sleeve extend slightly beyond the sidewalls 46, 48 and abut the end flanges of adjacent sleeves as illustrated in FIG. 6 to form a generally rectangular-shaped opening 64 between the side walls of adjacent sleeves. The openings serve a similar purpose as the openings 60 between the rear walls 44 of interconnected sleeves.

The side walls 46, 48 of each of the sleeves 14 also include a pair of longitudinally-extending C-shaped channels 66 projecting therefrom. The channels allow the sleeves attached to a sleeve support plate 68 with screws or other fasteners that extend through holes on the support plate and into the channels. The sleeve support plate also supports electrical connectors 70 as best illustrated in FIG. 4 that each connect with a corresponding terminal 72 on each of the repeater cards.

When the sleeves 14 are interconnected as depicted in FIG. 6, they form a rack of sleeves that may be configured to receive and support eight double-wide repeater cards or sixteen single-wide cards. The size of the enclosure 10 may be modified to hold any number of repeater cards as a matter of design choice.

The heat sink manifolds 20–26 are positioned around the sleeves 14 so that they directly contact the front walls 42 of the sleeves. The heat sink manifolds 16 and 18 touch the side walls 48 of the sleeves to conduct heat from the sleeves and cards. The enclosure preferably includes six such manifolds, two of which are configured as doors as described in more detail below.

Figure 5:
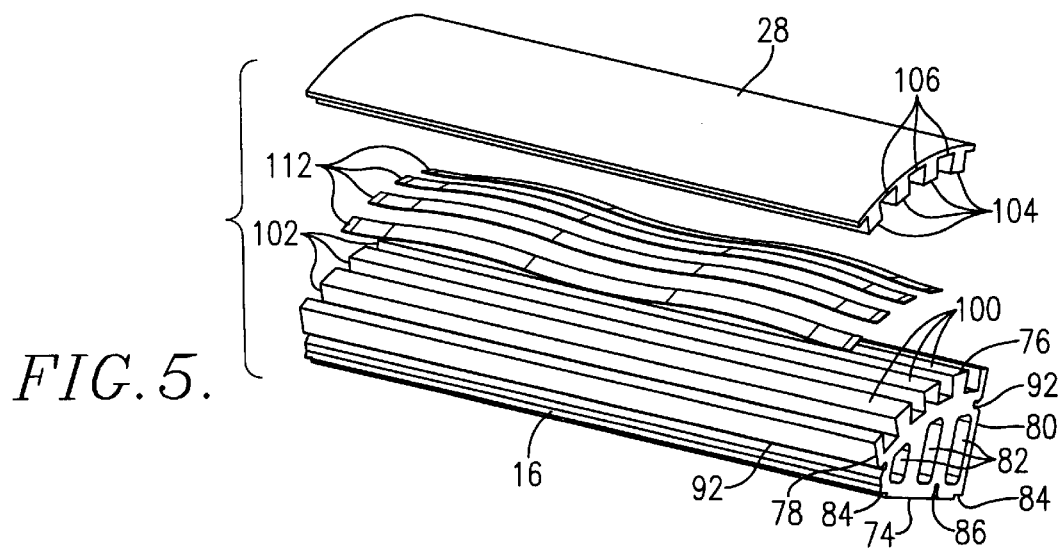
FIG. 5 is an exploded view of a heat sink manifold, outer panel, and leaf springs of a portion of the enclosure.

As best illustrated in FIG. 5, each manifold 16–26 includes a generally flat inner wall 74, a curved outer wall 76, and a pair of connecting side walls 78, 80. A plurality of enclosed air passageways 82 are formed between the inner and outer walls to reduce the material and, therefore, the overall weight of the manifolds and to dissipate heat from the manifolds by convection.

The ends of the inner wall include recesses 84 for interlocking with the corresponding flanges 62, 63 on the front walls 42 of the sleeves 14. The inner wall also includes an elongated, longitudinally-extending key slot 86. The key slot allows each manifold to be connected between a pair of end plates 88, 90 as illustrated in FIG. 6 by screws or other fasteners that extend through holes in the end plates and into the key slots. Similar key slots 92 are formed in the two side walls 78, 80 for the same purpose. The end plates 88, 90 sandwich the manifolds 16–26 around the sleeves 14 so that the sleeves and manifolds are in direct metal-to-metal contact at all times to improve conduction of heat therebetween.

The end plate 88 is bolted or otherwise attached to a base pan 94 (FIGS. 1 and 3) that is in turn attached to a pair of L-shaped mounting legs 96. The mounting legs are in turn bolted or otherwise attached to a mounting plate 98 that may be bolted to a wall or standoff so that the enclosure is mounted generally horizontally as depicted in FIG. 1.

Returning to FIG. 5, each manifold 16-26 also includes a series of spaced-apart, outwardly-projecting ribs 100 defining a plurality of spaced-apart channels 102 therebetween. The side walls of the ribs diverge outwardly from one another so that the end of each rib is slightly wider than its base. Conversely, the surface of each channel is slightly wider than the opening between adjacent ribs.

The outer panels 28–38 circumscribe the manifolds 16–26 as best illustrated in FIGS. 4 and 5. The enclosure preferably includes six outer panels, one for each manifold. Two of the outer panels are configured as doors as described in more detail below.

Each outer panel 28-38 is curved to match the contours of its corresponding manifold 16-26 and includes a series of inwardly projecting ribs 104 defining a plurality of spaced-apart channels 106 therebetween that are substantially identical to the ribs and channels on the manifolds. Each outer panel is attached to its corresponding manifold by sliding the ribs on the outer panel into the corresponding channels of the manifold to form a dove-tail connection therebetween.

As best illustrated in FIGS. 3 and 4, the manifolds 16, 18 and outer panels 28, 30 that form the top of the enclosure 10 are hinged to the end plates 88, 90 so that they serve as doors that can be opened to permit access to the rack of card-receiving sleeves 12. When closed, the manifolds of the doors make contact with the cards placed in the sleeves to conduct heat from the cards.

The cover 40 is configured for sliding over the outer panels 28–38 to protect the repeater cards 12 from exposure to the elements and damage from vandalism. As illustrated in FIG. 1, the cover is preferably pot-shaped and includes a cylindrical side wall 106 and a circular end wall 108 closing one end thereof. A handle 110 may be positioned on the end wall for use in handling the cover.

The cover side wall 106 includes a slight taper or draft angle so that the open end of the cover has a slightly larger diameter than the closed end. This permits the open end of the cover to more easily fit over the outer panels. The leading edge of each of the outer panels 28–38 is also beveled as best illustrated in FIG. 3 to further facilitate the placement of the cover over the outer panels. The cover may be sealed and locked in place over the outer panels with a ring-type collar 111 that fits over and can be clamped tightly against the base pan.

To provide an uninterrupted path for thermal conduction of heat from the repeater cards 12 to the cover 40, it is important that the outer panels 28–38 firmly contact the inner surface of the cover when the cover is placed thereover. To this end, a plurality of elongated leaf springs 112 preferably formed of spring steel are positioned in the channels of each manifold or its corresponding outer panel to bias the outer panels outwardly from the manifolds as best illustrated in FIGS. 4 and 5. The springs allow the outer panels to "float" relative to the manifolds so that the outer panels compress inwardly toward the manifold when subjected to an inward force that overcomes the force of the springs but then return to their outwardly extended position when no force is applied thereto. However, because of the taper on the ribs and channels of the manifolds and outer panels, the outer panels always remain attached and in physical contact with the manifolds.

When placed over the outer panels 28–30, the cover 40 biases the outer panels slightly inward against the outward biasing force of the leaf springs 112. This ensures direct metal-to-metal contact between the entire interior surface area of the cover and the entire exterior surface area of the outer panels to improve heat conduction therebetween. When the cover is removed, the leaf springs bias the outer panels to their normal, outwardly extended positions.

The enclosure 10 also preferably includes a series of circumscribing fins 114 extending outwardly from the cover 40. The fins increase the effective surface area of the cover to improve convection of heat therefrom to ambient air. Holes or slots may be formed in the fins to allow air to pass therethrough for convecting heat from the cylindrical wall of the cover.

Figure 2:
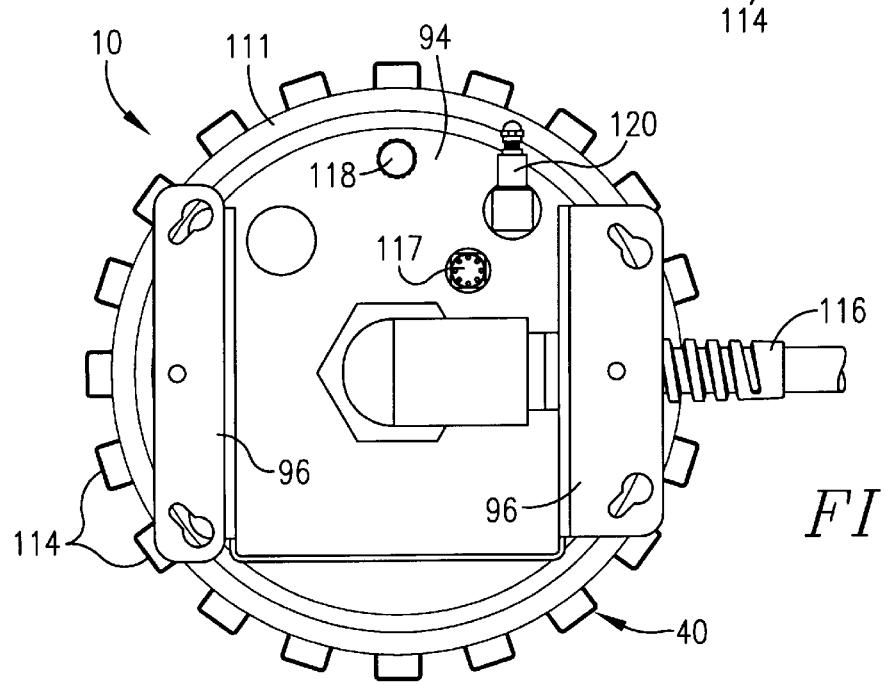
FIG. 2 is an end view of the enclosure with its mounting plate removed.

Cabling that connects to the repeater cards enters the enclosure via a threaded conduit 116 that extends through the base pan 94 as illustrated in FIG. 2. A pressure relief valve 117 may also communicate with the interior of the enclosure through the base pan to release excess pressure that may build up within the enclosure.

A pressure cutoff valve 118 is provided to stop the flow of air from the pressurized cable to the interior of the enclosure. An air stem 120 provides a means to pressurize the enclosure with a compressor or standalone pressurized tank.

In operation, repeater cards 12 are inserted into the enclosure 10 by removing the cover 40, opening the hinged doors, and then placing the repeater cards into the card-receiving sleeves. As described above, each sleeve may be configured to receive either two single-wide cards or a single double-wide card. Once all the repeater cards have been placed into the sleeves, the doors are once again closed and the cover replaced over the outer panels.

Heat that is generated during operation of the repeater cards 12 is removed therefrom by a combination of thermal conduction and thermal convection dissipation methods. Specifically, heat is conducted from the cards to the walls of the sleeves 14, from the sleeves to the heat sink manifolds 16–26, from the heat sink manifolds to the outer panels 28–38, from the outer panels to the cover 40, and from the cover to the fins 114. Each of these components is directly or indirectly in contact with the other components to provide a continuous thermal conduction path from the repeater cards to the outside of the cover.

Heat from the repeater cards 12 is also convected away from the cards by air passing through the openings 60, 64 and by air circulating around and through the fins 114. Heat convection that occurs because of the openings between the sleeves also prevents conduction of heat from one card to another via the walls of the sleeves.

Although the invention has been described with reference to the preferred embodiment illustrated in the attached drawing figures, it is noted that equivalents may be employed and substitutions made herein without departing from the scope of the invention as recited in the claims. For example, although the enclose of the present invention has been described and illustrated as being particularly useful for dissipating heat from telecommunications repeater cards, it may also be used to dissipate heat from other electronic components. Additionally, the size of the enclosure may be varied to handle any number of repeater cards or other electronic components.

Having thus described the preferred embodiment of the invention, what is claimed as new and desired to be protected by letters patent includes the following:

What is claimed is:

1. An enclosure for protecting repeater cards from exposure to harmful elements and for dissipating heat generated by the repeater cards, the enclosure comprising:
   a plurality of card-receiving sleeves for receiving the repeater cards, the sleeves including walls for conducting heat from the cards;
   a heat sink manifold in contact with at least one wall of the sleeves for conducting heat from the sleeves;
   an outer panel in contact with the heat sink manifold for conducting heat from the manifold;
   a removable cover configured for sliding over the outer panel to protect the cards from exposure; and
   at least one biasing mechanism operably coupled with the outer panel for biasing the outer panel into physical contact with the cover when the cover is placed thereover to improve conduction of heat from the outer panel to the cover.

2. The enclosure as set forth in claim 1, the biasing mechanism including at least one spring positioned between the heat sink manifold and the outer panel for biasing the outer panel outwardly away from the heat sink manifold.

3. The enclosure as set forth in claim 1, the biasing mechanism including a plurality of elongated leaf springs positioned between the heat sink manifold and the outer panel for biasing the outer panel outwardly away from the heat sink manifold.

4. The enclosure as set forth in claim 3, the manifold including a plurality of spaced-apart ribs forming a plurality of spaced-apart channels therebetween, the outer panel including a plurality of spaced-apart ribs defining a plurality of spaced-apart channels therebetween that interlock with the ribs and the channels of the manifold to hold the outer panel in contact with the manifold, the leaf springs each being positioned in one of the channels of the manifold or the outer panel to bias the outer panel outwardly away from the manifold.

5. The enclosure as set forth in claim 1, the cover including an outer cover wall and a plurality of fins extending outwardly from the cover wall for convecting heat from the cover to ambient air.

6. The enclosure as set forth in claim 1, the card-receiving sleeves including structure for interlocking to one another to form a rack of sleeves, the sleeves also including structure for creating open areas between interconnected sleeves in the rack for permitting convection of heat from the sleeves to air in the open areas.

7. The enclosure as set forth in claim 1, further including at least one door shiftable to an open position to permit access to the card-receiving sleeves.

8. The enclosure as set forth in claim 7, the enclosure including a plurality of heat sink manifolds and outer panels.

9. The enclosure as set forth in claim 8, the door including one of the heat sink manifolds and one of the outer panels.

* * * * *

UNITED STATES PATENT AND TRADEMARK OFFICE
CERTIFICATE OF CORRECTION

PATENT NO. : 6,118,662
DATED : September 12, 2000
INVENTOR(S) : Randy Hutchison and Robert Schiffbauer It is certified that error appears in the above-identified patent and that said Letters Patent are hereby corrected as shown below:

[75] Inventors: delete "Shiffbauer" and substitute therefor -- Schiffbauer --

Signed and Sealed this

Twenty-fourth Day of April, 2001

Attest:

NICHOLAS P. GODICI

Attesting Officer

Acting Director of the United States Patent and Trademark Office